United States Patent [19]
Holcombe

[11] Patent Number: 5,864,132
[45] Date of Patent: Jan. 26, 1999

[54] FULL IMAGE OPTICAL DETECTOR WITH SPACED DETECTOR PIXELS

[75] Inventor: Roger S. Holcombe, Santa Barbara, Calif.

[73] Assignee: Raytheon Company, Lexington, Mass.

[21] Appl. No.: 819,405

[22] Filed: Mar. 17, 1997

[51] Int. Cl.⁶ .................................................. H01L 27/00

[52] U.S. Cl. .................................. 250/208.1; 250/208.2; 250/214.1; 250/216

[58] Field of Search .............................. 250/208.1, 208.2, 250/214.1, 216, 214 R; 359/95

[56] References Cited

U.S. PATENT DOCUMENTS

| | | | |
|---|---|---|---|
| 5,400,161 | 3/1995 | Lambert, Jr. | 250/216 |
| 5,665,963 | 9/1997 | Campbell | 250/208.1 |

*Primary Examiner*—Stephone B Allen
*Attorney, Agent, or Firm*—W. C. Schubet; G. H. Lenzen, Jr.

[57] ABSTRACT

An optical device is positioned to receive an image and to deflect it into separate portions onto the mutually spaced photosensitive surfaces of an array of staring array detectors (2a, 2b). The optical device, which can be implemented with prisms (14a, 14b) or mirrors (17a, 17b), directs the deflected light portions only onto the photosensitive portions of the array, avoiding non-photosensitive gaps (12) between the detectors. The portions of the image received by the detectors combine to form the overall image.

20 Claims, 6 Drawing Sheets

FULL IMAGE OPTICAL DETECTOR WITH SPACED DETECTOR PIXELS

BACKGROUND OF THE INVENTION

1. Field of the Invention

This invention relates to photodetection of images, and more specifically to optical devices for enhancing the quality of images detected by multiple staring detector arrays.

2. Description of the Related Art

A Staring Array Detector (SAD) is a real time photodetection device which includes solid state optical sensors for converting optical energy into electrical signals. The SAD has a detector with a photosensitive surface made up of an array of semiconductor pixels that sense brightness, darkness and grey tones. Light from an image focused onto the pixels is continually processed by a Readout Integrated Circuit (ROIC) to produce electrical signals representing the intensity of the light. An image is formed by combining the electrical signal from each pixel. The resolution of the image detected by a SAD depends on the size of each pixel, with smaller pixels providing greater resolution. Smaller pixel sizes achieved to date are approximately 400 square microns. The size of the image detected, on the other hand, depends on the size of the array, which in turn depends on the size and number of the pixels in each array.

The SADs that have a large array of pixels, on the order of 1028×1028 pixels, have the advantage of providing a large surface for image detection. One such SAD is the Aladan Array, manufactured by Santa Barbara Research Center. The problem with a large array of pixels is that they have complex circuitry and are expensive to manufacture. One solution to forming a large but less expensive detection surface, or to forming a larger than conventional array, is to place several SADs in contact next to one another with their edges butting. The combination of the SADs' individual detectors provides a large photodetection surface. The problem with this solution, referred to as the edge butting SAD, is that the ROIC of each SAD forms a boundary surrounding its detector. When two SADs are placed next to one another, their ROICs, which have no photosensitive properties, form a non-photosensitive gap between their detectors. The gaps cause discontinuities in the image detected, resulting in poor image detection.

One solution which avoids the gaps between the detectors of the edge butting SADs is a SAD that has its ROIC formed beneath its detector surface. One such SAD is the Edge Butted Array, manufactured by Santa Barbara Research Center. The detectors of these SADs can contact one another with no ROIC between them, thus eliminating any gaps in the image detected. This approach, however, is very costly and difficult to manufacture.

Another method of image detection using SADs is to form a narrow array of pixels and mechanically move the array across an image to be detected. At each location a portion of the image is detected, and all of the image portions are then combined to form the overall image. One such detector is the BSTS, manufactured by Santa Barbara Research Center. The problem with this type of image detector is that it does not provide real time image detection. At each instant of time, only a portion of an image is detected. If the image changes between two detection locations, portions of two different images are detected, which when combined produce an inaccurate detection of either image.

SUMMARY OF THE INVENTION

The present invention is a novel optical device that eliminates the gaps formed in the images detected by edge butting SADs and provides a low cost and easily manufacturable solution to the problem of creating large SAD photodetection surfaces.

The optical device is a deflector that is positioned to receive light from an image that is focused by an imager and to deflect the incoming light into image portions which are received by the SADs' detectors. The deflector directs the deflected image portions only onto the SADs' detectors, avoiding the gaps between the detectors. The combination of the image portions received by the detectors forms the overall image received by the deflector.

In one embodiment the deflector includes multiple prisms, equal to the number of SADs and positioned to deflect the image portions onto respective SAD detectors. In another embodiment multiple mirrors are used instead of prisms.

DETAILED DESCRIPTION OF THE INVENTION

Figure 1A:
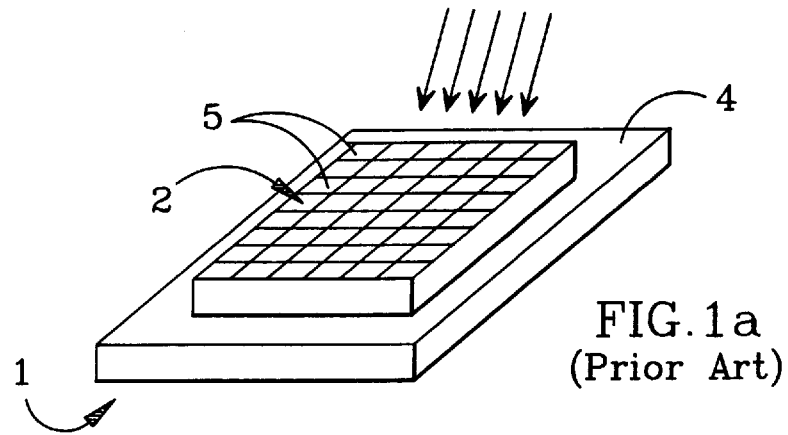
FIG. 1a is a simplified perspective view of a conventional staring array detector (SAD) with its photosensitive detector positioned over its readout integrated circuitry (ROIC).

FIG. 1a is a simplified perspective view of a conventional SAD 1 which encodes an optical image into an electrical signal. The SAD 1 includes an optical detector 2 which has a photosensitive surface and is positioned on top of a wider ROIC board 4. The photosensitive surface of the detector 2 is made up of rows and columns of photosensitive semiconductor pixels 5. The pixels receive optical energy and provide electrical signals to the ROIC, which combines them into an image. An example of a SAD is the 480×640 InSb VISMIR (visible through mid-wave infrared) Focal Plane Array manufactured by the Santa Barbara Research Center, with pixel dimensions of 20 microns by 20 microns.

Figure 1B:
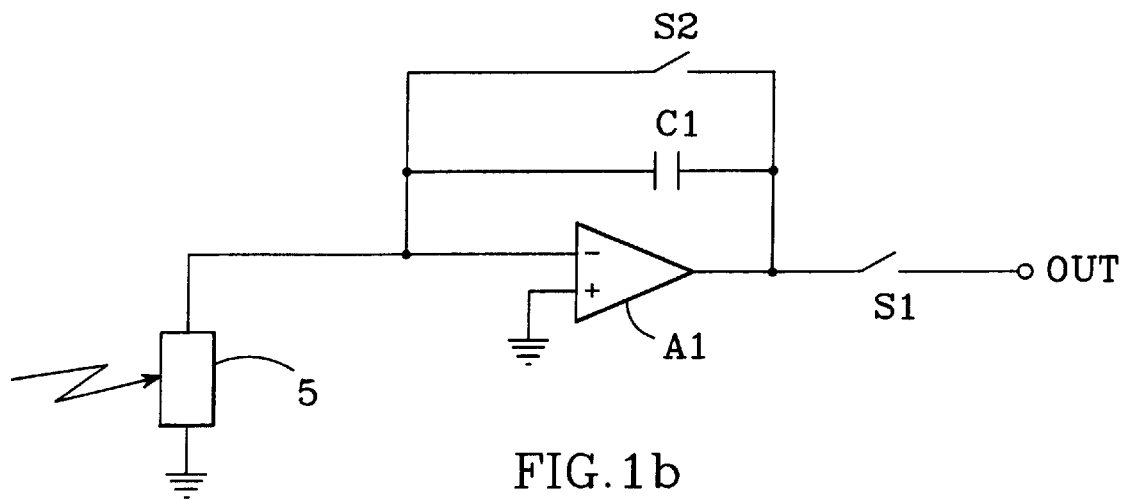
FIG. 1b is a schematic diagram of part of the ROIC and SAD which converts the optical energy received by a pixel in the SAD's detector into electrical energy.

FIG. 1b is a simplified schematic diagram of part of the ROIC circuitry which converts the optical energy received by each pixel of the SAD into an electrical signal.

The output of the system is a series of short images of the focused image of the scene, similar to moving pictures. Electronic sampling of the voltage level of each detector element (pixel) is used to produce an image of the desired scene. The voltage of each pixel corresponds to the light intensity of that portion of the focused image. When reconstructed in a display the individual pixels form a complete picture.

The basic operation consists of the infrared energy illuminating the photo diode detector 5, which in turn generates electrical current. Commonly used materials for a detector include alloys of Indium Antimonide or Mercury Cadmium Tellurium. This current flows to a storage capacitor C1 which increases in voltage level according to the intensity of the illuminating and sampling time. The voltage of the capacitor is measured to form the intensity level of the appropriate display picture.

However, a limitation in the characteristics of the detector requires additional circuitry to accomplish the desired operation. The detector can be thought of as a current generator with limited voltage generating capability. Beyond a certain voltage, the detector breaks down and the generated energy flows to ground. Circuitry is required to permit higher voltage levels to be delivered to the capacitor.

The illustrated circuit uses a capacitive feedback transimpedance amplifier (CTIA) A1. This is typical of several circuits that overcome the voltage limits of the detector by providing an infinite impedance load with a virtual ground to the detector output. A switch S1 is connected between the amplifier output and an output terminal T1, while another switch S2 is connected in parallel with the capacitor C1 across the amplifier's input and output.

In operation, with both switches open, focused infrared scene energy is directed to the detector, which generates electrical current. The current flows to the capacitor C1, which increases in voltage proportional to the incoming radiant intensity and time duration. The amplifier A1 provides the voltage to the capacitor in excess of the breakdown voltage of the detector.

At the end of the sampling period, switch S1 is closed and the voltage is measured by conventional processing circuitry, which combines it with signals from the rest of the array to produce the desired picture.

Following this the switch S2 is closed, shorting the capacitor to zero volts. Both switches are reopened and the sampling cycle is repeated. Conventional switch timing and control circuitry may be used for this purpose.

Figure 2:
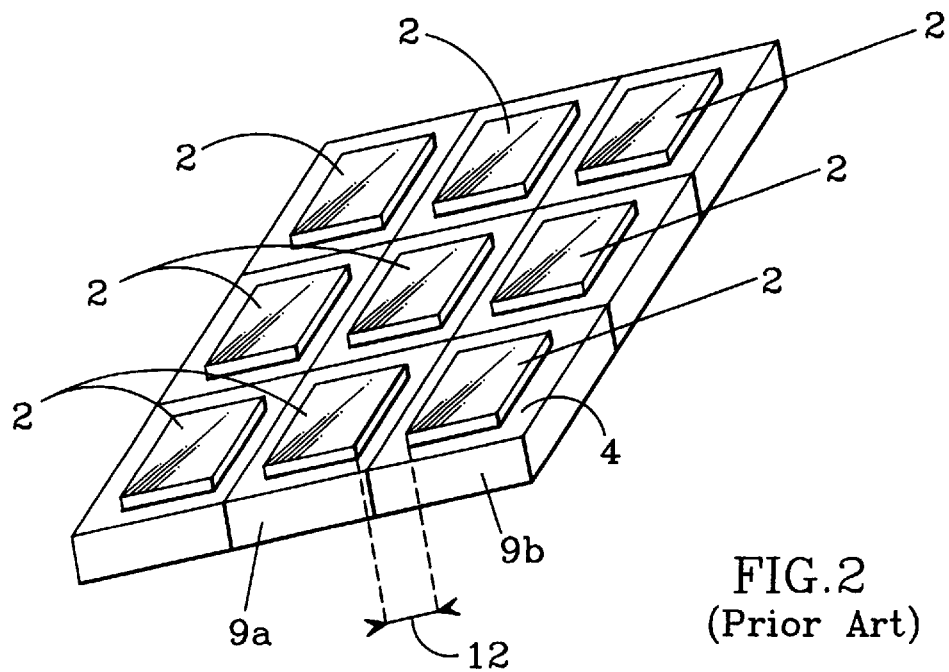
FIG. 2 is a perspective view of a configuration of nine SADs positioned on a single plane with edge butting ROIC boards.

FIG. 2 is a perspective view of nine SADs positioned in contact on a single plane with the edges of their ROIC boards 4 butting. The detection surface is therefore the combination of the surface area of all of the detectors 2. This is common practice because it is very expensive and difficult to manufacture a SAD with a large detection surface. However, the limit to this approach, as stated above, is that the ROIC board 4 is not photosensitive, creating a gap in the detection of light that falls between two detectors 2. As an example, a gap 12 with no photosensitive properties is shown between two SADs 9a and 9b.

Up to this point, existing SAD technology has been described. The present invention includes a passive optical device (requiring no power) that is positioned to receive light from an image to be detected by edge butting SADs and to deflect it into image portions that land only upon the SAD's detectors. In this way, wasted illumination of the non-photosensitive gaps created by the ROICs between the SADs' detectors is avoided. The image detected by the SADs therefore has no missing parts. Among the ways to implement the desired light deflection are multiple prisms and multiple mirrors, discussed below.

Figure 3:
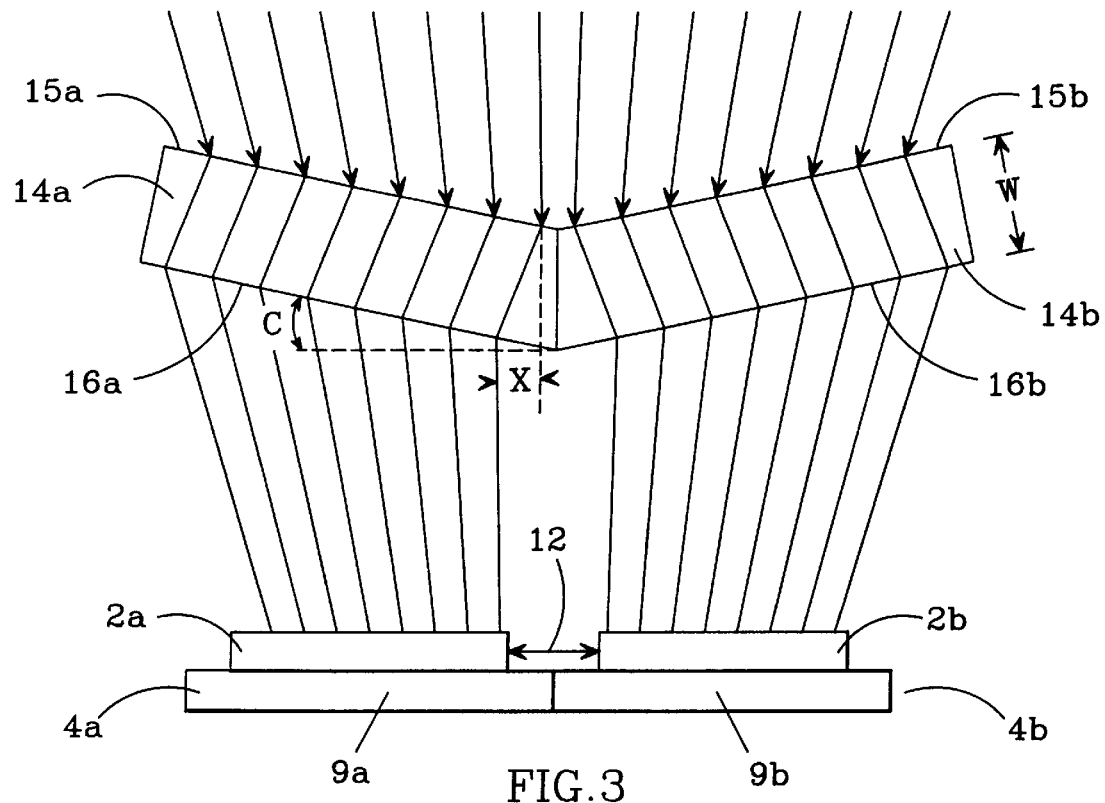
FIG. 3 is an elevation view of a detector in accordance with the present invention implemented with two prisms which are positioned over two edge butting SADs.

Referring to FIG. 3, the two SADs 9a and 9b from FIG. 2 are shown on ROIC boards 4a and 4b with the gap 12 between their respective photodetectors 2a and 2b. In this figure the optical device of this invention is implemented with two prisms 14a and 14b. The prisms are transparent parallelograms made of material such as germanium. The prisms 14a and 14b have respective light receiving surfaces 15a and 15b which are parallel to their respective light exiting surfaces 16a and 16b. The receiving surfaces 15a and 15b of the prisms receive incoming light from an image which has been focused by an imaging device. The imaging device, which is not shown, typically includes objective lenses or reflecting mirrors. The prisms deflect the incoming light through refraction without separating it spectrally, with the light exiting from surfaces 16a and 16b. This introduces an optical path length in the path of light rays incident upon the prisms, such that a light ray leaving the prisms is offset from its point of entrance. The offset can be established to position the light rays exiting the prism to avoid any gaps and land only upon the SADs' detectors 2a and 2b. For example, a ray of light leaving prism 14a at surface 16a is offset by a distance X from its point of entrance at surface 15a. By controlling the amount of offset, a ray of light can be positioned to land only on a detector, such as detector 2a of SAD 9a, instead of on the non-photosensitive gap 12. Thus, a ray of light that without the prisms would land on gap 12, is instead received close to the center of prisms 14a and 14b and offset to land on a detector.

The offset distance X is established at half the width of the gap 12. Among the factors that effect the offset distance are the index of refraction of the prism, the angle c of the prism's exit surface 16a with respect to the surface of the detector 2a, the prism thickness W (its optical prescription) and the width of the gap 12 between two detectors.

For a SAD to clearly detect an image, incoming rays must be focused such that the imaging plane lies on the surface of the SAD's detector. Typically, an imaging device focuses an image directly onto the surface of a detector. The introduction of the prisms of the present invention into the light path from the imaging device to the surface of a detector changes the optical path length of the rays provided by the imaging device. Therefore, the detector surfaces must be adjusted up or down to accommodate for this change in the optical path length of the focused light provided by the imaging device. If the thickness W of the prisms is uniform and the image provided by the imager falls on a single plane, then the detectors can be positioned on a single plane. However, if the image provided by the imager is non-planar, then either the detectors can be positioned on different planes to receive a focused image with the thickness of the prisms being constant, or the thickness of the prisms can be changed to focus the non-planar image on a single plane on which the photodetector surface lies. Each prism and its respective detector can be manipulated by conventional mechanisms independently of other prisms and their detectors.

Figure 4:
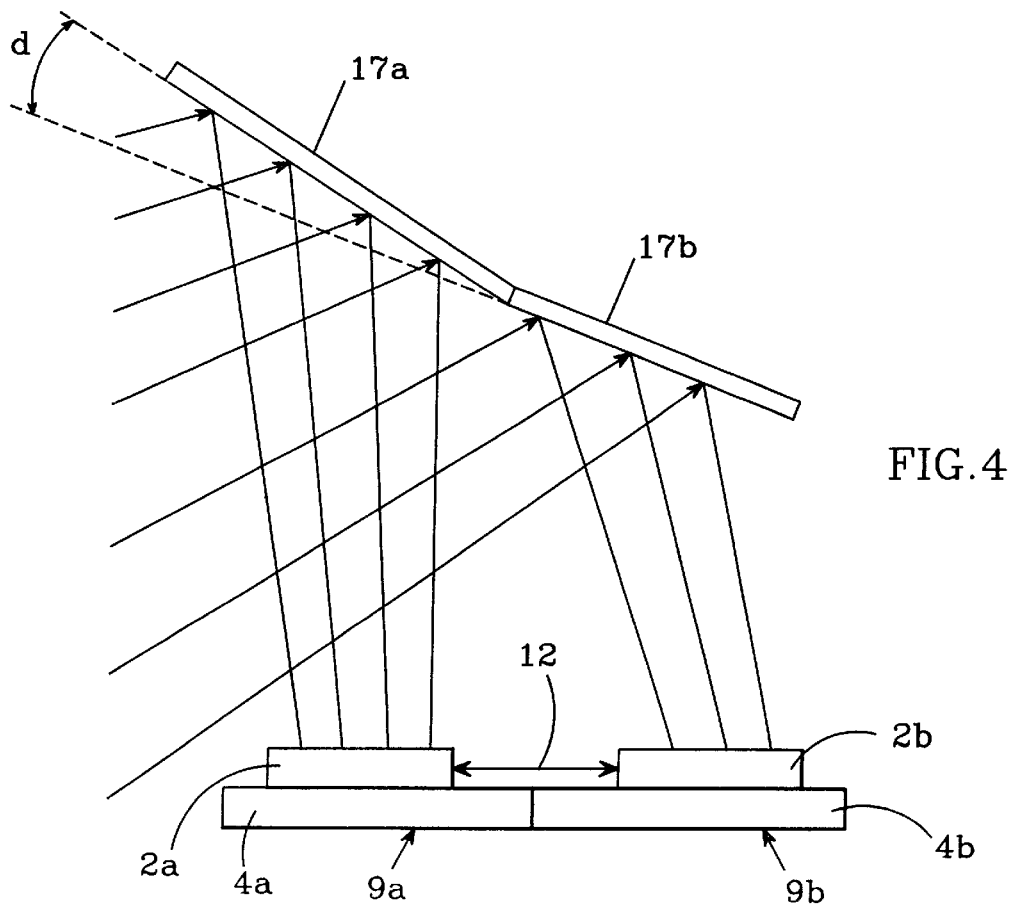
FIG. 4 is an elevation view of an alternate embodiment in which mirrors are positioned over two edge butting SADs.

FIG. 4 is a side view of the optical device in accordance with the present invention implemented with two mirrors 17a and 17b. SADs 9a and 9b are the same as the SADs 9a and 9b shown in FIG. 2. Mirrors are used instead of prisms to deflect incoming light from an imaging device onto the detectors surfaces. Each SAD has a corresponding mirror, with mirrors 17a and 17b reflecting images onto the detectors 2a and 2b of SADS 9a and 9b, respectively. The angle d between mirrors 17a and 17b causes the incoming rays to be deflected only onto the SADs' detectors 2a and 2b, respectively, avoiding the gap 12 between them. Furthermore, the distances between the SAD's detector surfaces and their respective mirrors are established such that the focused light received by the mirrors is reflected to land in focus on their respective detector surfaces. This can be done by moving the mirrors up or down with respect to the surface of the detectors. Unlike prisms, mirrors do not change the optical path length of the light rays they receive.

Figure 5:
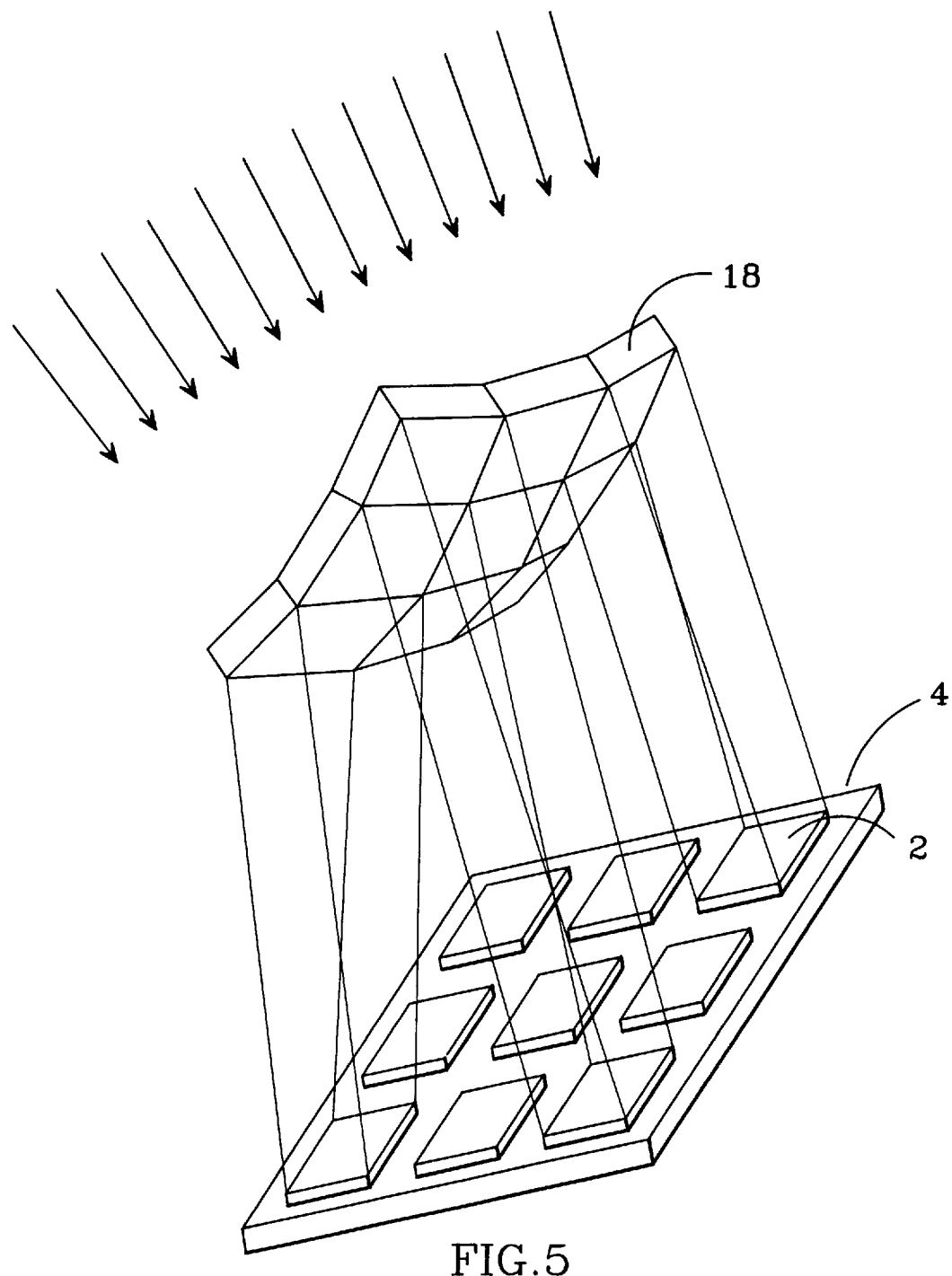
FIG. 5 is a perspective view of a configuration of nine prisms positioned to direct an incoming image onto the detectors of the nine edge butting SADs shown in FIG. 2.

FIG. 5 is a perspective view of a configuration of nine prisms 18 positioned to direct focused light from an image provided by an imaging device onto the detectors of the nine edge butting SADs shown in FIG. 2. The prisms 18 are positioned in an array which is concave with respect to the photodetectors 2 to deflect the incoming focused light into portions which are received by respective detectors. The gaps between the detectors do not receive any of the image, which is fully detected by the detectors. The pattern of configuring the prisms can be varied according to the arrangement of detectors, with a respective prism for each detector.

Figure 6A:
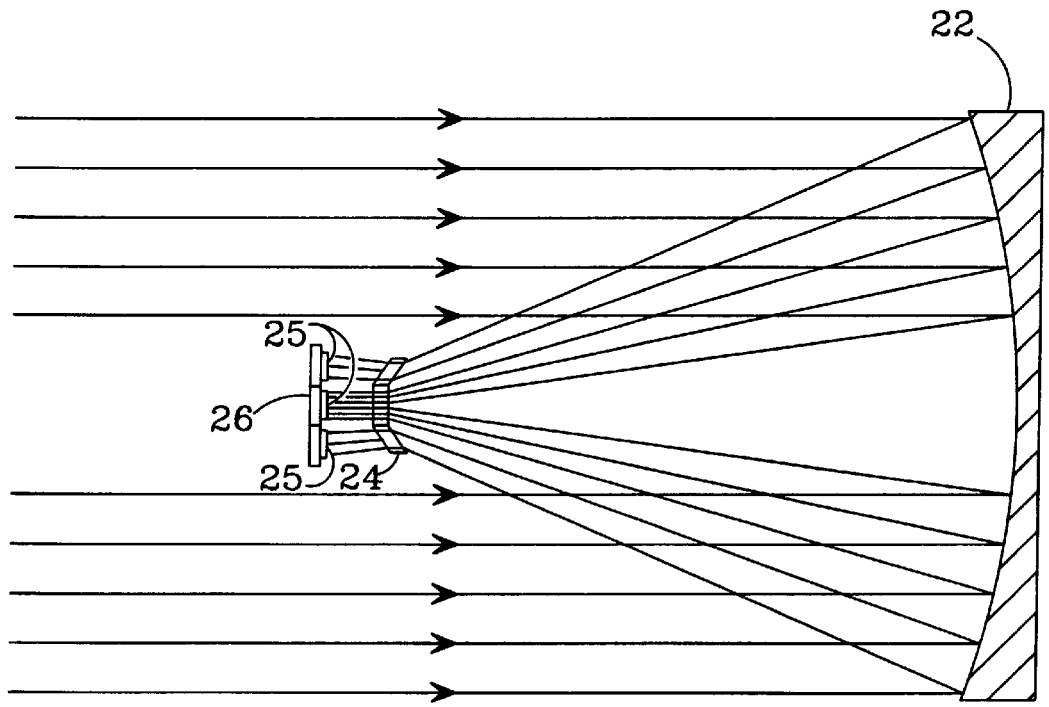
FIG. 6a is optical diagram of a telescope with a reflecting mirror in which the present deflector implemented with prisms can be used.

FIG. 6a is an optical diagram of a telescope 20 which incorporates the optical device of the present invention. The telescope 20 includes a reflecting mirror 22 as an imaging device that receives and focuses parallel unfocused light rays provided from an object such as a planet. A configuration of prisms 24 receives the focused light and distributes it in portions onto respective detectors 25 of a set of edge butting SADs 26. Nine prisms as described in reference to FIG. 5 could be used for nine detectors. The detectors 25 are positioned to receive the focused image on their surfaces such that the gaps between them are avoided. The combination of the image portions received by the detectors 25 forms the overall image received by the prisms 24.

Figure 6B:
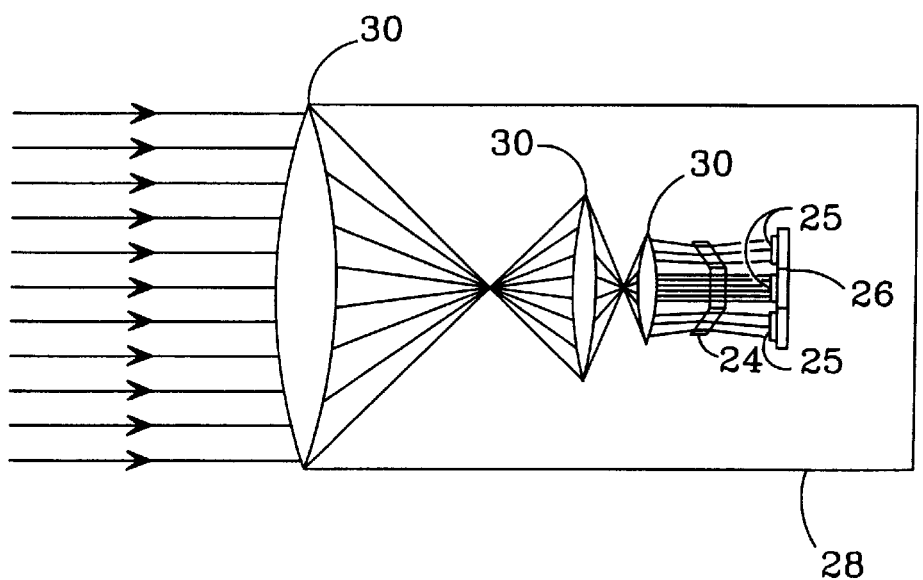
FIG. 6b optical diagram of a telescope with optical lenses which create an image suitable for detection by the deflector of the present invention implemented with prisms.

FIG. 6b is an optical diagram of another telescope 28 incorporating the present invention. The imaging device of the telescope 28 is a set of objective lenses 30 that demagnify and focus incoming parallel light rays. This focused light is received by a configuration of prisms 24 which distributes the light in portions onto the detectors 25 of a set of edge butting SADs as described above in reference to FIG. 6a.

Figure 7A:
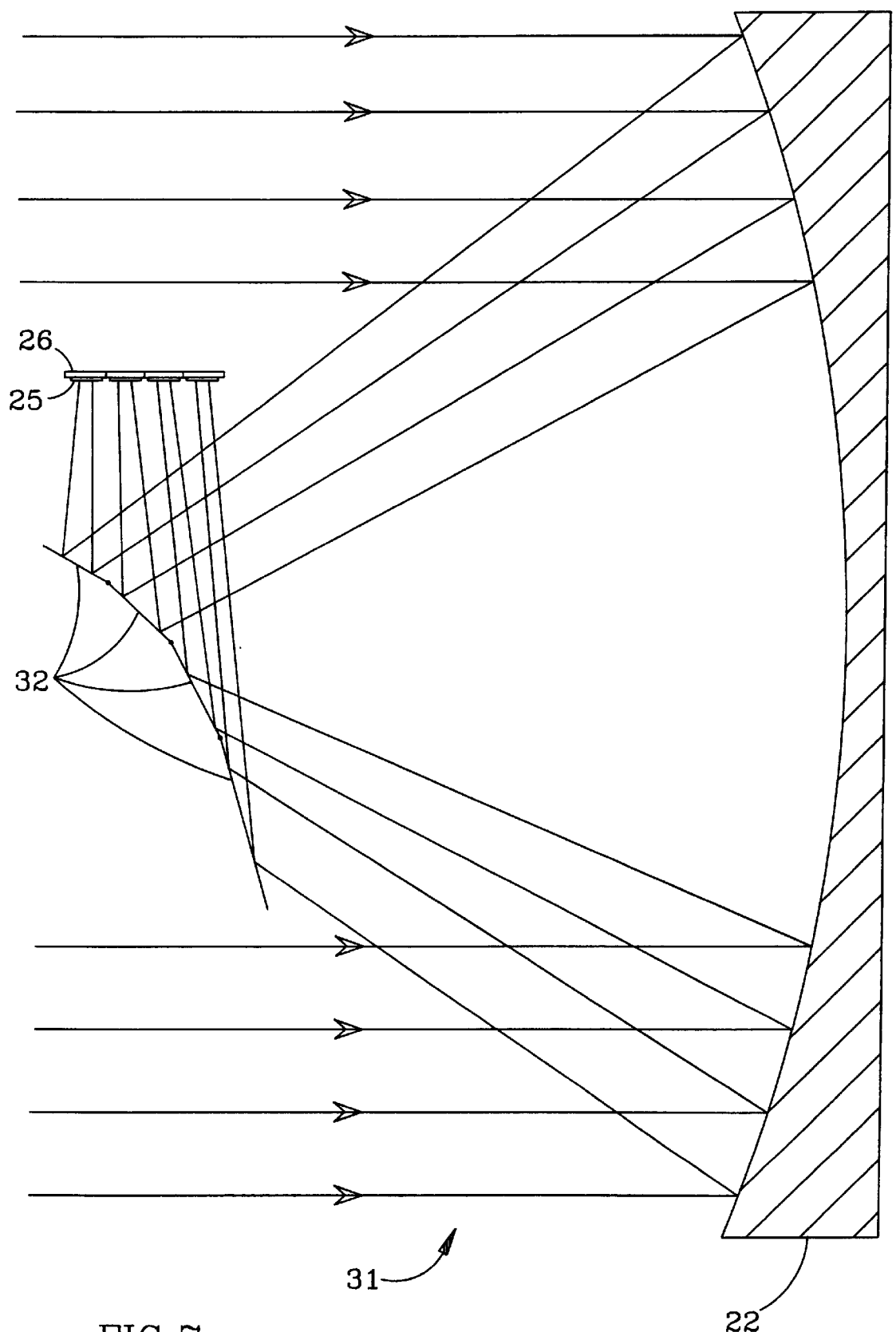
FIG. 7a is an optical diagram of a telescope with a reflecting mirror in which the present deflector implemented with mirrors can be used.

FIG. 7a is an optical diagram of a telescope 31 which focuses incoming parallel light rays using a reflecting mirror 22 as shown in FIG. 6a. The focused light is received by a configuration of mirrors 32 (four mirrors are illustrated for four detector pixels) which are arranged in an array that is convex with respect to the detectors 25 of a set of edge butting SADs 26 to reflect the light into portions that land on respective detectors. Normally one mirror would be provided for each detector, with the number of detectors depending upon the detector area required for the incoming image. FIG. 7a shows a simple configuration of three mirrors reflecting focused light onto three detectors. The image is received by the detectors in the manner described in FIG. 6a such that gaps between the detectors 25 are avoided.

Figure 7B:
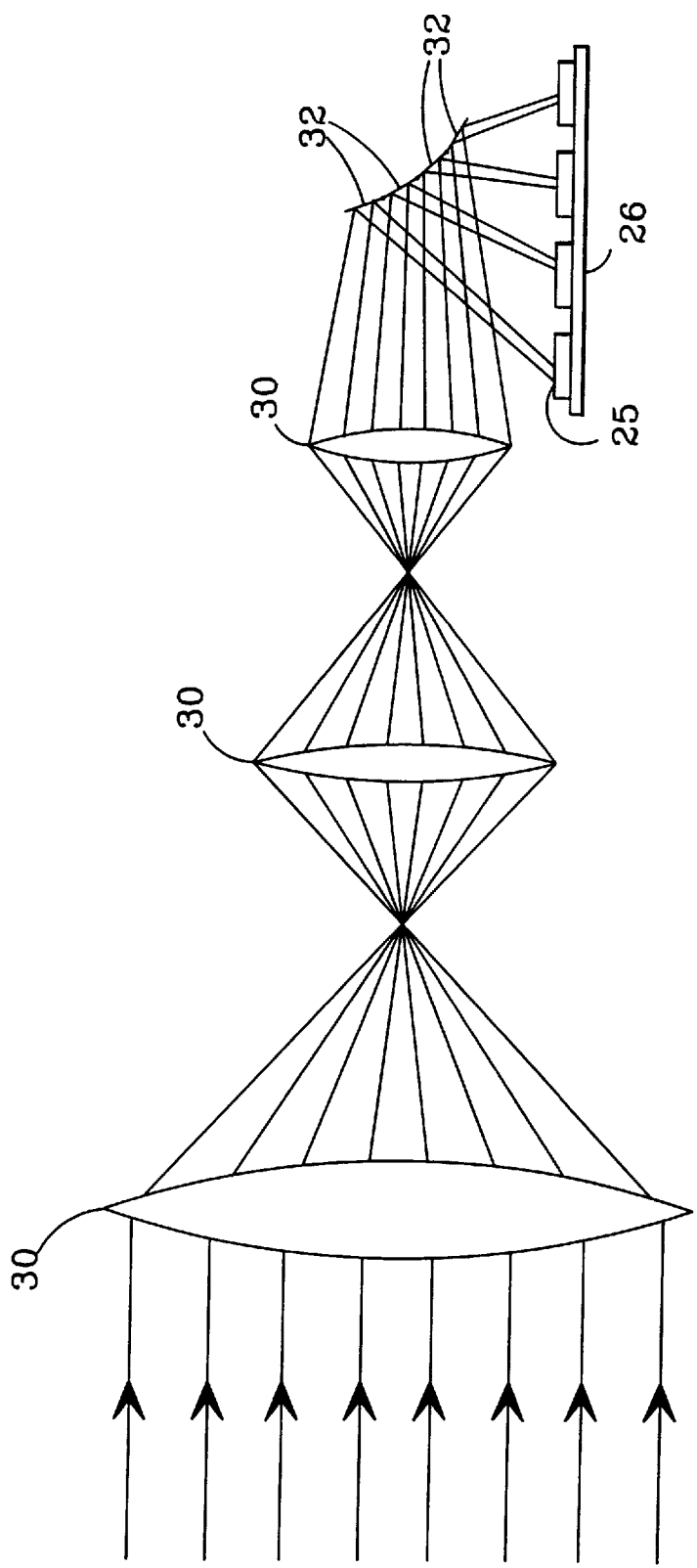
FIG. 7b is an optical diagram of a telescope with optical lenses which create an image suitable for detection by the deflector of the present invention implemented with mirrors.

FIG. 7b is an optical diagram of a telescope 33 that uses a set of objective lenses 30 to focus parallel light rays onto a configuration of mirrors 33. The mirrors 33, which are similar to the mirrors described in reference to FIG. 7a, reflect the incoming light onto the detectors 25 of a set of edge butting SADs as described above.

While particular embodiments of the invention have been shown and described, numerous alternate embodiments will occur to those skilled in the art. For example, the optical device of the present invention can be implemented using holographs or binary optics, both devices functioning to direct incoming light rays away from gaps between SADs and onto their detectors. The energy measured can include all ranges of radiant energy from ultraviolet through long wave infrared. Furthermore, many types of detection surfaces can be used, such as photographic film, and they are not limited to those described above. Accordingly, it is intended that the invention be limited only in terms of the appended claims.

I claim:

1. An image detector for detecting light from an image, comprising:

multiple photodetectors having respective mutually spaced photosensitive detector surfaces, and an optical device positioned to receive light from an image and to direct said light in spatially separate portions, without separating the light spectrally, onto respective photodetector detector surfaces, the combination of said light portions forming said image.

2. An image detector as in claim 1, wherein said photodetectors comprise staring array detectors with photosensitive detector surfaces arranged in an array of photosensitive pixels.

3. An image detector as in claim 1, wherein said detector surfaces lie in a common plane.

4. An image detector for detecting light from an image, comprising:

multiple photodetectors having respective mutually spaced photosensitive detector surfaces, and an optical device positioned to receive light from an image and to direct said light in separate portions onto respective photodetector detector surfaces, the combination of said light portions forming said image, wherein said optical device comprises multiple prisms corresponding to said photodetectors, with said prisms positioned to deflect respective portions of said image onto respective detector surfaces of said photodetectors.

5. An image detector as in claim 4, wherein each prism is comprised of transparent material and has one surface for receiving a portion of the image light and another surface, parallel to its light receiving surface, from which that portion of focused light is directed to the detector surface of a respective photodetector.

6. An image detector as in claim 4, wherein said prisms are flat and angled to each other in a generally convex orientation with respect to said photodetectors.

7. An image detector for detecting light from an image, comprising:

multiple photodetectors having respective mutually spaced photosensitive detector surfaces, and an optical device positioned to receive light from an image and to direct said light in separate portions onto respective photodetector detector surfaces, the combination of said light portions forming said image, wherein said optical device comprises multiple mirrors corresponding to said photodetectors, with said mirrors positioned to reflect respective portions of said image onto respective detector surfaces of said photodetectors.

8. An image detector as in claim 7, wherein said mirrors are spaced from their respective photodetectors' detector surfaces so that the reflected portions of said image are received in focus on said detector surfaces.

9. An image detector as in claim 7, wherein said mirrors are flat and angled to each other in a generally convex orientation with respect to said photodetectors.

10. An image detector for receiving parallel unfocused light rays and detecting an image, comprising:

an imaging device for focusing said light rays into an image, a plurality of photodetectors having respective mutually spaced photosensitive detector surfaces, and an optical device positioned to receive said image and to direct it in spatially separate focused portions, without separating the light spectrally, onto respective detector surfaces of said photodetectors, the combination of said image portions forming said image.

11. An image detector as in claim 10, wherein said photodetectors are positioned in edge butting contact with each other and with their respective detector surfaces separated by non-photosensitive gaps.

12. An image detector as in claim 11, wherein said deflected image portions are focused by said imaging device onto the photosensitive surfaces of said photodetectors, avoiding said gaps.

13. An image detector for receiving parallel unfocused light rays and detecting an image, comprising:

an imaging device for focusing said light rays into an image, a plurality of photodetectors having respective mutually spaced photosensitive detector surfaces, said photodetectors positioned in edge butting contact with each other and with their respective detector surfaces separated by non-photosensitive gaps, and an optical device positioned to receive said image and to direct it in separate focused portions onto respective detector surfaces of said photodetectors, the combination of said image portions forming said image, said optical device comprising respective prisms for said photodetectors, said prisms positioned between said imaging device and said photodetectors to deflect respective portions of said image into said image portions.

14. An image detector as in claim 13, wherein said prisms are flat and angled to each other in a generally convex orientation with respect to said photodetectors.

15. An image detector for receiving parallel unfocused light rays and detecting an image, comprising:

an imaging device for focusing said light rays into an image, a plurality of photodetectors having respective mutually spaced photosensitive detector surfaces, said photodetectors positioned in edge butting contact with each other and with their respective detector surfaces separated by non-photosensitive gaps, and an optical device positioned to receive said image and to direct it in separate focused portions onto respective detector surfaces of said photodetectors, the combination of said image portions forming said image, said optical device comprising multiple mirrors for said photodetectors, said mirrors positioned to reflect respective portions of said image onto respective detector surfaces of said photodetectors.

16. An image detector as in claim 15, wherein said mirrors are flat and angled to each other in a generally convex orientation with respect to said photodetectors.

17. An image detector for receiving parallel unfocused light rays and detecting an image, comprising:

an imaging device for focusing said light rays into an image, said imaging device comprising a telescope with a reflecting mirror which focuses parallel unfocused light rays into said image, plurality of photodetectors having respective mutually spaced photosensitive detector surfaces, and an optical device positioned to receive said image and to direct it in separate focused portions onto respective detector surfaces of said photodetectors, the combination of said image portions forming said image.

18. An image detector for receiving parallel unfocused light rays and detecting an image, comprising:

an imaging device for focusing said light rays into an image, said imaging device comprising a telescope with objective lenses which focuses parallel unfocused light rays into said image, a plurality of photodetectors having respective mutually spaced photosensitive detector surfaces, and an optical device positioned to receive said image and to direct it in separate focused portions onto respective detector surfaces of said photodetectors, the combination of said image portions forming said image.

19. An image detector for detecting light from a continuous image, comprising:

multiple photodetectors having respective mutually spaced photosensitive detector surfaces that are separated from each other by gaps between said detector surfaces, an optical device positioned to receive a continuous pattern of light from a continuous image, to divide said continuous pattern of light into a plurality of mutually separated image portions, and to direct said mutually separated image portions onto respective ones of said detector surfaces so that substantially none of the light from said continuous image is directed onto the gaps between said detector surfaces, with each image portion directed onto only a single corresponding detector surface.

20. An image detector for receiving parallel and substantially continuous unfocused light rays and detecting an image from said light rays, comprising:

an imaging device for focusing said light rays into a continuous image, a plurality of photodetectors having respective mutually spaced photosensitive detector surfaces that are separated from each other by gaps between said detector surfaces, and an optical device positioned to receive said continuous image, to divide said continuous image into a plurality of mutually separated image portions, and to direct said mutually separated image portions onto respective ones of said detector surfaces so that substantially none of the light from said continuous image is directed onto the gaps between said detector surfaces, with each image portion directed onto only a single corresponding detector surface.

* * * * *